(12) United States Patent
Odaka

(10) Patent No.: US 7,514,023 B2
(45) Date of Patent: Apr. 7, 2009

(54) ELECTRICALLY CONDUCTIVE MATERIAL

(75) Inventor: Hidefumi Odaka, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 11/846,561

(22) Filed: Aug. 29, 2007

(65) Prior Publication Data

US 2008/0054229 A1 Mar. 6, 2008

Related U.S. Application Data

(63) Continuation of application No. PCT/JP2006/304131, filed on Mar. 3, 2006.

(30) Foreign Application Priority Data

Mar. 25, 2005 (JP) .............................. 2005-088957

(51) Int. Cl.
*H01B 1/08* (2006.01)

(52) U.S. Cl. ............ 252/520.1; 252/520.5; 204/192.15; 204/192.29

(58) Field of Classification Search .............. 252/520.1, 252/520.5; 204/192.15, 192.29
See application file for complete search history.

(56) References Cited

U.S. PATENT DOCUMENTS

| | | | |
|---|---|---|---|
| 5,720,904 A | 2/1998 | Jones | |
| 2006/0099140 A1* | 5/2006 | Abe | 423/594.13 |
| 2006/0270209 A1* | 11/2006 | Mitsui et al. | 438/608 |

FOREIGN PATENT DOCUMENTS

| JP | 8-64035 | 3/1996 |
|---|---|---|
| JP | 9-503739 | 4/1997 |
| JP | 9-278445 | 10/1997 |
| JP | 2001-221763 | 8/2001 |
| JP | 2002-275623 | 9/2002 |
| JP | 2005-154252 | 6/2005 |

OTHER PUBLICATIONS

Solis et al "Gas-sensing properties of SnxWO3+x mixed oxide thick films", Sensors and Actautors B 48 (1998) 322-327.*
Solis et al "Synthesis of a new compound semiconductors in the Sn-W-O system . . . ", Sensors and Actuators B 68 (2000) 286-292.*
Solis et al "Structure and characterization of semiconducting tin and tungsten mixed oxides", Phys. Scr. T79 216-219 (1999) Abstract Only.*
The 65th Meeting, 2004, Japan Society of Applied Physics, Abstract Papers No. 2, p. 530, New transparent metals: Nb-doped anatase $TiO_2$.

* cited by examiner

*Primary Examiner*—Mark Kopec
(74) *Attorney, Agent, or Firm*—Oblon, Spivak, McClelland, Maier & Neustadt, P.C.

(57) ABSTRACT

To provide an electrically conductive material excellent in electrical conductivity and capable of exhibiting p-type electrical conductivity.

An electrically conductive material containing Sn, W and oxygen, characterized in that when its chemical composition is expressed as $Sn(x)W(y)O(z)$, x, y and z satisfy the following formulae (1) to (4):

$$0.7 < x < 1.3 \quad (1)$$

$$0.7 < y < 1.3 \quad (2)$$

$$3.2 < z < 4.5 \quad (3)$$

$$0.001 \leq (x-y) \leq 0.1 \text{ or } 0.001 \leq (y-x) \leq 0.1. \quad (4)$$

16 Claims, 4 Drawing Sheets

ELECTRICALLY CONDUCTIVE MATERIAL

BACKGROUND OF THE INVENTION

1. Field of the Invention

The present invention relates to an electrically conductive material suitably used for a flat panel display (FPD) and a current drive type light emitting device (LED).

2. Discussion of Background

Heretofore, for a FPD such as a liquid crystal display device, a plasma display and an organic LED and for a solar battery, a substrate provided with a transparent electrode film as a transparent electrode has been used. As a material for the transparent electrode film, indium oxide type, zinc oxide type and tin oxide type are known. ITO (tin-doped indium oxide) which is of indium oxide type is particularly famous and widely used As reasons why ITO is widely used, its low resistance and favorable patterning properties are mentioned, but in view of effective utilization of resources, development of a material which will replace indium is desired at present.

As a material of the transparent electrode film, as two element i.e. two-dimensional crystals other than the above material, a $TiO_2$ type material has been known. For example, by doping anatase-form $TiO_2$ with several % of Nb, a material having a specific resistance in a figure in 1E-4 ($1 \times 10^{-4}$) Ω·cm can be prepared (for example, Non-Patent Document 1). Further, as three element i.e. three-dimensional crystals, $ZnSnO_3$ and $Zn_2SnO_4$ have been known to be a transparent electrode film, and materials having specific resistances in a figure in 1E-3 Ω·cm and 1E-2 Ω·cm, respectively, can be prepared by preparation under appropriate film formation conditions.

However, most of these materials are materials only exhibiting n-type electrical conductivity. In the field of an organic LED and a solar battery, there is a need for improvement of power generation efficiency or luminous efficiency by injecting holes to a film made of a material having p-type electrical conductivity directly from a transparent electrode. However, many materials including the above materials exhibit only n-type electrical conductivity, and it has been difficult to prepare a material exhibiting p-type electrical conductivity. Further, a three-dimensional transparent electrically conductive tin oxide film containing tin oxide and tungsten oxide has been known (for example, Patent Document 1). The transparent electrically conductive tin oxide film contains tin as the main component and tungsten as an additive, and is formed by applying a solution of a mixture prepared by adding a tungsten compound to a tin compound, to a heated transparent substrate by spraying. Although it may be possible to obtain favorable electrical conductivity by such a method, n-type and p-type materials cannot selectively be formed.

Non-Patent Document 1: The 65th Meeting of the Japan Society of Applied Physics, Abstract Papers No. 2, p. 530, "New transparent metals: Nb-doped anatase $TiO_2$"

Patent Document 1: JP-A-8-64035

SUMMARY OF THE INVENTION

The present invention provides an electrically conductive material excellent in electrical conductivity and capable of exhibiting not only n-type but also p-type electrical conductivity.

The present invention provides an electrically conductive material containing Sn, W and oxygen, characterized in that when its chemical composition is expressed as Sn(x)W(y)O(z), x, y and z satisfy the following formulae (1) to (4):

$$0.7 < x < 1.3 \quad (1)$$

$$0.7 < y < 1.3 \quad (2)$$

$$3.2 < z < 4.5 \quad (3)$$

$$0.001 \leq (x-y) \leq 0.1 \text{ or } 0.001 \leq (y-x) \leq 0.1 \quad (4)$$

The present invention further provides the above electrically conductive material which has an alpha stannous tungstate type crystal structure, and the above electrically conductive material which is in a film shape.

According to the electrically conductive material of the present invention, p-type electrical conductivity can easily be exhibited, and a material exhibiting n-type and p-type electrical conductivity can be selectively formed by easy operation of adjusting the composition.

DETAILED DESCRIPTION OF THE PREFERRED EMBODIMENTS

The electrically conductive material mainly used as a transparent electrically conductive film has a heavy effective mass since its valence band mainly comprises oxygen 2p orbital and resultingly, it only has small mobility regarding the hole conduction. Further, the more stable Fermi energy level is present near the conduction band by the self-compensating effect in many cases, and accordingly, almost no material exhibiting p-type electrical conductivity has been known.

The present inventor has found that an electrically conductive material containing Sn, W and oxygen (hereinafter referred to as a $SnWO_4$-containing material) is a material exhibiting favorable electrical conductivity and is capable of being a material exhibiting not only p-type but also n-type electrical conductivity by an easy method of changing the composition.

Further, he has found that such a $SnWO_4$-containing material can be utilized in various shapes, for example, when a $SnWO_4$-containing material is formed into a thin film, it has suitable transparency and electrical conductivity as a transparent electrically conductive film, and such a $SnWO_4$-containing film can be a film exhibiting not only p-type but also n-type electrical conductivity by an easy method of changing the composition, similar to the $SnWO_4$-containing material.

Figure 1:
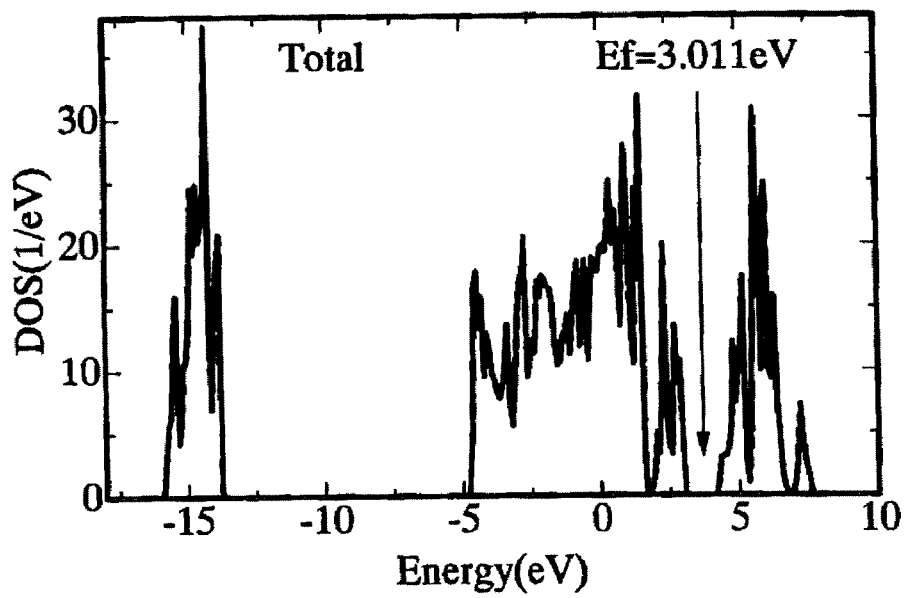
FIG. 1 is a diagram illustrating the density of states of $SnWO_4$ (Sn:W:oxygen=1:1:4).

FIG. 1 illustrates the density of states of $SnWO_4$ crystals (Sn:W:oxygen=1:1:4) obtained by first-principles calculation (simulation). The upper portion of the valence band is split into two bands i.e. a band within a range of from about −5 to about 1.8 eV and a band within a range of from about 1.9 to about 2.8 eV. $E_f$ in FIG. 1 illustrates the Fermi energy i.e. the position of the highest modified molecular orbital occupied by an electron.

Figure 2:
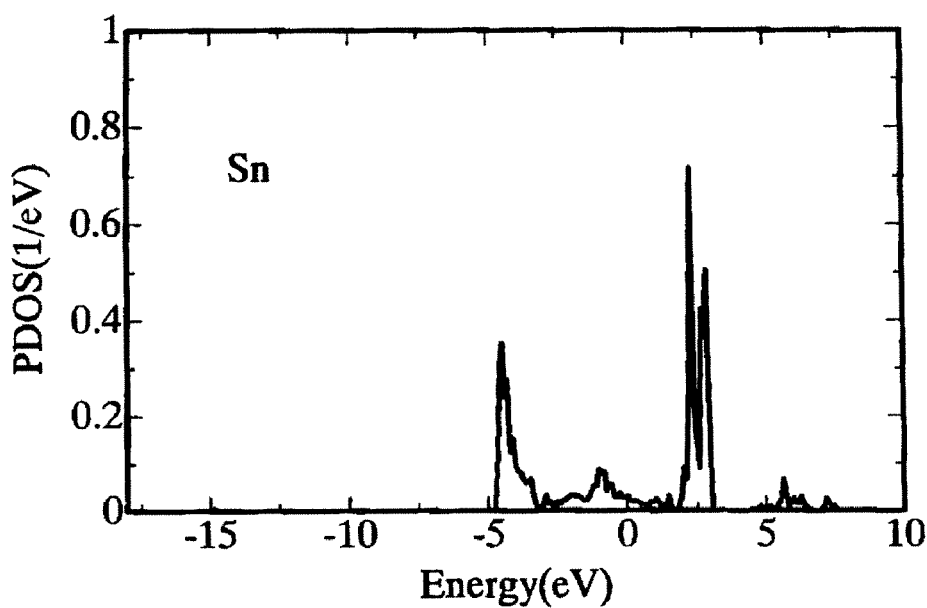
FIG. 2 is a diagram illustrating the local density of states (s-state) of Sn in FIG. 1.
Figure 3:
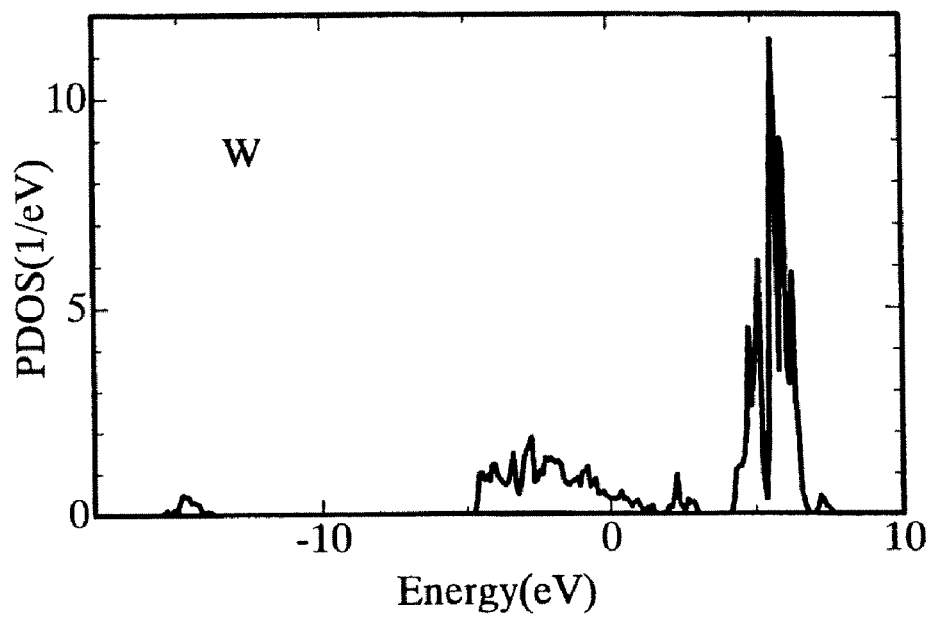
FIG. 3 is a diagram illustrating the local density of states (d-state) of W in FIG. 1.

The densities of states having the above density of states decomposed into molecular orbitals of the respective constituting elements are shown in FIGS. 2 and 3. FIG. 2 illustrates the density of states of Sn (s-state) and FIG. 3 illustrates the density of states of W (d-state). The valence band at the upper portion includes 5s orbital of Sn and 5d orbital of W. That is, many of components in the electron orbitals of the metal elements are contained in the valence band. This is a characteristic structure of the electron orbitals as compared with that the valence band of $In_2O_3$, $SnO_2$, ZnO or the like is mainly composed of 2p orbital of oxygen. That is, by the electron orbital of the metal element constituting the upper portion of the valence band, $SnWO_4$ forms a valence band with a relatively small effective mass as compared with a conventional electrically conductive material such as $In_2O_3$, $SnO_2$ or ZnO. This indicates that this material has high electrical conductivity.

Figure 4:
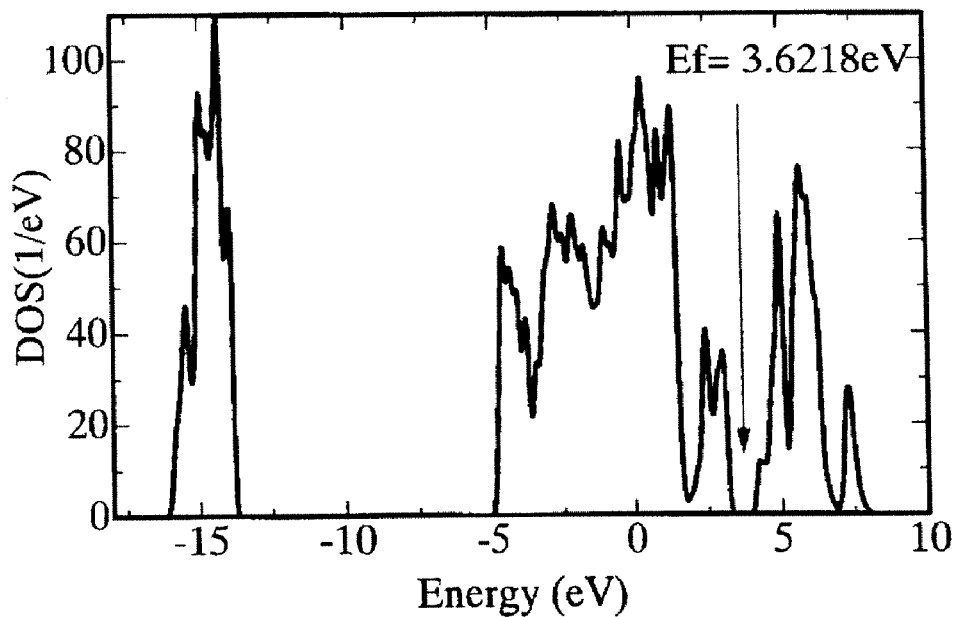
FIG. 4 is a diagram illustrating another example of the density of states of $SnWO_4$ (Sn:W:oxygen=1:1:4).
Figure 5:
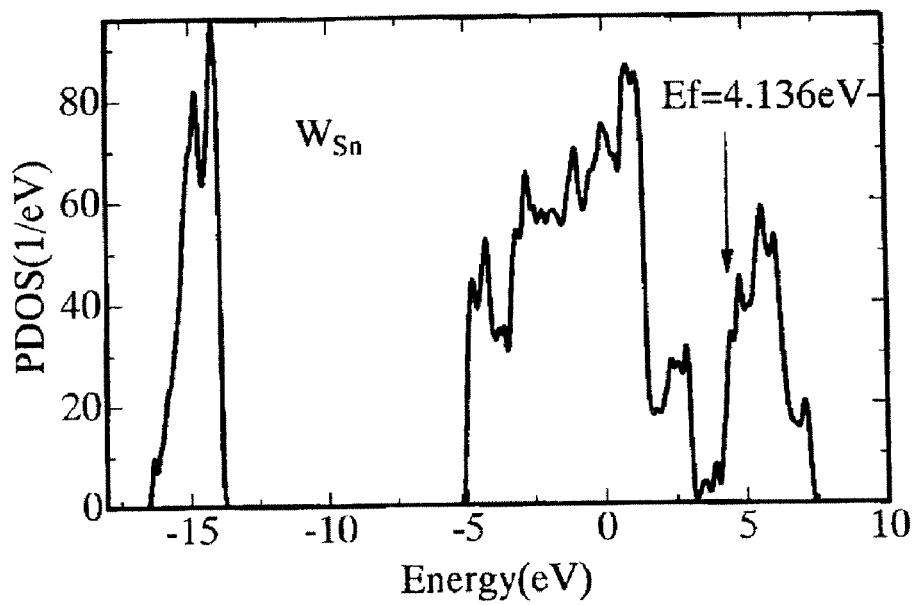
FIG. 5 is a diagram illustrating the density of states of $SnWO_4$ (Sn:W:oxygen=15:17:64).
Figure 6:
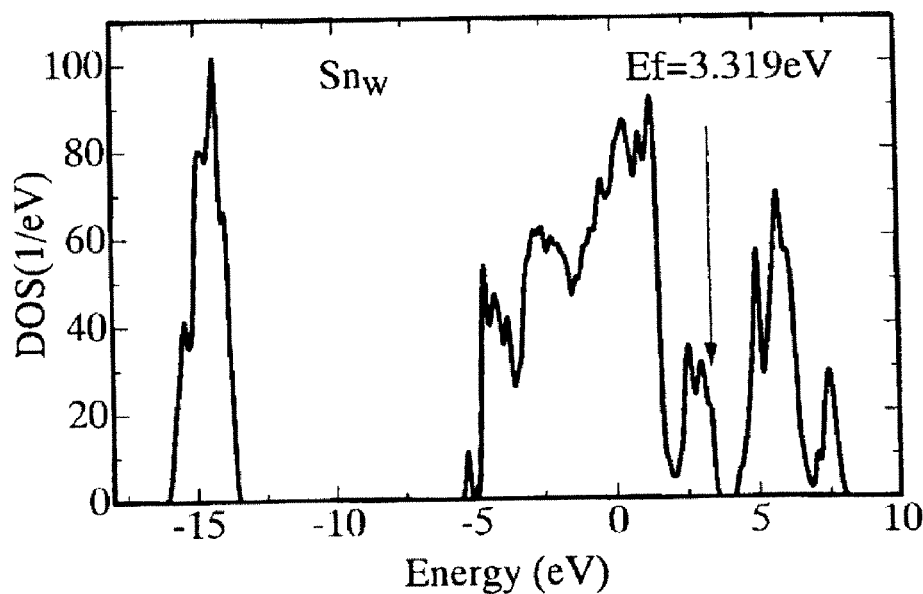
FIG. 6 is a diagram illustrating the density of states of $SnWO_4$ (Sn:W:oxygen=17:15:64).

Further, the density of states of $SnWO_4$ when the composition in $SnWO_4$ is changed is shown. FIG. 4 illustrates the density of states of $SnWO_4$ when Sn and W are present in a ratio of 1:1, FIG. 5 illustrates the density of states of $SnWO_4$ when (Sn:W:oxygen=15:17:64), and the density of states of $SnWO_4$ when (Sn:W:oxygen=17:15:64). It is shown from FIG. 6 that the Fermi energy lies in the valence band. Further, it is shown from FIG. 5 that the Fermi energy lies in the conduction band. That is, by controlling the ratio of Sn and W in $SnWO_4$, the Fermi energy level of $SnWO_4$ can be controlled. The electrical conductivity of a material is determined by the product of the carrier density and the mobility. The carrier density corresponds to the number of states at the Fermi energy and the mobility is related with the effective mass, and the smaller the effective mass, the higher the mobility. Considering such relation of the electrical conductivity of a material and characteristics of the electronic structure of $SnWO_4$, it is sufficiently estimated that this material exhibits p-type electrical conductivity in a region of a composition containing Sn in a larger amount than W and exhibits n-type electrical conductivity in a region of a composition containing W in a larger amount than Sn. Further, it is sufficiently estimated that a material exhibiting not only p-type but also n-type electrical conductivity can be selectively prepared by easy operation of adjusting the composition of Sn and W.

In the $SnWO_4$-containing material, when its chemical composition is expressed as Sn(x)W(y)O(z), the range of x is preferably $0.7<x<1.3$, particularly preferably $0.8 \leq x \leq 1.2$, more preferably $0.9 \leq x \leq 1.1$, with a view to preparing a material having low electrical conductivity. Further, the range of y is preferably $0.7<y<1.3$, particularly preferably $0.8 \leq y \leq 1.2$, more preferably $0.9 \leq y \leq 1.1$, with a view to preparing a material having low electrical conductivity. Further, the range of z is preferably $3.2<z<4.5$, particularly preferably $3.5 \leq z \leq 4.3$, more preferably $3.8 \leq z \leq 4.2$, with a view to preparing a material having low electrical conductivity.

Further, the total content of Sn, W and oxygen in the $SnWO_4$-containing material is preferably at least 70 at %, particularly preferably at least 80 at %, more preferably at least 90 at % based on the entire $SnWO_4$-containing material, whereby when it is formed into a film shape, it will have excellent electrical conductivity and transparency.

The $SnWO_4$-containing material can be a material exhibiting high electrical conductivity and exhibiting p-type electrical conductivity, when, when its chemical composition is expressed as Sn(x)W(y)O(z), $0.001 \leq (x-y) \leq 0.1$, preferably $0.01 \leq (x-y) \leq 0.05$. On the other hand, when $0.001 \leq (y-x) \leq 0.1$, preferably $0.01 \leq (y-x) \leq 0.05$, the material can be a material exhibiting high electrical conductivity and exhibiting n-type electrical conductivity.

Further, regarding the relation between x and y, when x−y is a negative value, the material exhibits n-type electrical conductivity, and when x−y is a positive value, the material exhibits p-type electrical conductivity.

Further, x+y and z are preferably in such a relation that $(x+y) \times 1.5 \leq z \leq (x+y) \times 2.5$, particularly $(x+y) \times 1.8 \leq z \leq (x+y) \times 2.2$, with a view to obtaining high electrical conductivity.

Namely, if there is no difference in the compositional ratio between Sn and W (if x=y), no high electrical conductivity can be exhibited. It becomes possible to form an oxide film having high electrical conductivity by providing a difference in the compositional ratio between two elements, not by an oxide film having two elements merely combined. The reason why high electrical conductivity can be exhibited by providing a difference between x and y is that the carrier concentration can be earned by providing a difference between x and y.

In the $SnWO_4$-containing material disclosed in Patent Document 1, there is no difference in the compositional ratio between Sn and W i.e. when its chemical composition is expressed as Sn(x)W(y)O(z), x=y, whereby n-type and p-type material cannot selectively be formed.

As described above, the $SnWO_4$-containing material is excellent in that n-type and p-type materials can selectively be formed easily by easy operation of adjusting the composition of Sn and W.

Further, the $SnWO_4$-containing material may contain impurities other than Sn, W and O and after-mentioned dopants. The content of impurities is preferably at most 15 mass % in view of transparency and electrical conductivity.

The $SnWO_4$-containing material is preferably crystalline with a view to improving electrical conductivity. As the crystal structure of the $SnWO_4$-containing material, alpha stannous tungstate type and beta stannous tungstate type are present. The $SnWO_4$-containing material particularly preferably has an alpha stannous tungstate type crystal structure with a view to obtaining high electrical conductivity. Particularly when it is in a film shape, it has such an advantage that a low resistance can be obtained with a small thickness. Further, when it is thin, it is excellent in transparency. In the case of a film shape, the sheet resistance is preferably at most $5 \times 10^4 \Omega/\square$, particularly preferably at most $1 \times 10^4 \Omega/\square$, more preferably at most $5 \times 10^3 \Omega/\square$, in view of the electrical conductivity.

Electrical conductivity may be controlled by adding an additional element to the $SnWO_4$-containing material. The content of metal elements other than Sn and W in the $SnWO_4$-containing material is preferably less than 20 at %, particularly preferably less than 10 at %, furthermore preferably less than 5 at %, with a view to not impairing electrical conductivity and transparency. Further, a light element such as nitrogen, carbon or fluorine may be contained within a range not to impair the properties of the present invention. The additional element may, specifically, for example, be at least one member selected from the group consisting of antimony, tantalum, bismuth, manganese, niobium, titanium, zirconium, vanadium, cobalt, zinc, nickel, molybdenum, indium and rhenium.

The $SnWO_4$-containing material can be used in various shapes. For example, it may be used as a bulk material or as a thin film. Namely, the $SnWO_4$-containing material can be used as a bulk material or as a source to form a $SnWO_4$-containing film.

Figure 7:
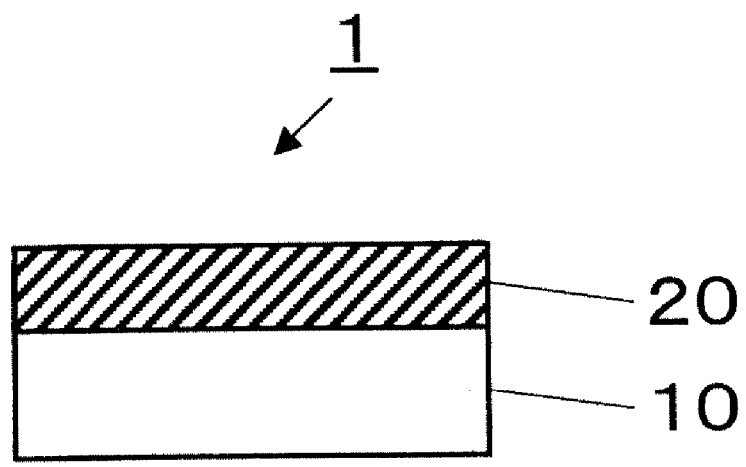
FIG. 7 is a cross-section schematically illustrating a substrate provided with a film when the electrically conductive material of the present invention is in a film shape.

FIG. 7 illustrates a substrate 1 provided with a $SnWO_4$-containing film when the $SnWO_4$-containing material of the present invention is used as a film. A SnWO$_4$-containing film 20 is formed on a substrate 10.

In the present invention, a substrate on which a SnWO$_4$-containing film is formed is not particularly limited, and may, for example, be an inorganic substrate such as a glass substrate or an organic substrate such as a plastic substrate. The glass substrate may, for example, be an alkali-containing glass substrate such as a soda lime silicate glass substrate or an alkali free glass substrate such as a borosilicate glass substrate. The average surface roughness Ra of the alkali free glass substrate is preferably about 0.1 to about 10 nm.

The method of forming a thin film of the SnWO$_4$-containing material is not particularly limited but is preferably a sputtering method with a view to easily forming a thin film of e.g. an electrode. In a case where a thin film is formed by a sputtering method, it is possible to form a SnWO$_4$-containing film by using the above SnWO$_4$-containing material as a target.

As the sputtering method, either a DC sputtering method or an AC sputtering method may be used. In a case where a SnWO$_4$-containing film is formed by a sputtering method, the substrate temperature and the pressure during film deposition are not particularly limited.

The target to be used in the case of film deposition by the sputtering method may be either an oxide target or a metal target. It is preferred to use an oxide target in view of the stability during film deposition. When an oxide target is used, film deposition by power control can easily be carried out, such being advantageous in controlling of the film thickness. Further, in a case where a metal target is used, a target containing tin and tungsten may be used, or a tin target and a tungsten target may be used in combination. It is preferred to use a tin target and a tungsten target in combination with a view to easily changing the ratio of tin and tungsten. The above ratio can easily be changed by adjusting the voltage applied to the target. The substrate temperature during sputtering is preferably from 250 to 600° C. with a view to obtaining high crystallinity.

As the material of a sputtering gas in the sputtering method, an inert gas such as an argon gas, an oxidizing gas such as oxygen, or a gas mixture of these gases, may be used.

The formed film is preferably subjected to heat treatment after film deposition. The heat treatment is preferred with a view to not only improving crystallinity of the film but also obtaining high electrical conductivity. The heat treatment is carried out preferably in an inert gas, particularly preferably in an Ar gas, containing from 1 to 5 vol % of hydrogen, at from 200 to 600° C. for from 10 to 100 minutes.

The thickness of the SnWO$_4$-containing film is preferably from 10 to 300 nm in view of transparency and electrical conductivity.

The composition range and the crystal structure of the formed SnWO$_4$-containing film are the same as in the case of the above-described SnWO$_4$-containing material.

The SnWO$_4$-containing film of the present invention is suitable as an electrode of a display device such as an LCD, an inorganic EL device, an organic EL device or a current drive type light emitting device (LED) or an electrode of a solar battery. Particularly, the SnWO$_4$-containing film can be a film exhibiting not only p-type but also n-type electrical conductivity by adjusting its composition. Therefore, such a thin film is particularly useful as an electrode in the field of a solar battery and a flat display such as an organic LED.

EXAMPLES

Example 1

A quartz substrate was prepared as a substrate, and by a DC sputtering method, a film with a thickness of 200 nm was formed on the substrate by using a two cathode sputtering apparatus provided with a metal tin target (metal tin: 99.9 mass %) and a metal tungsten target (metal tungsten: 99.9 mass %), employing 100 vol % of an oxygen gas as a sputtering gas.

The sputtering apparatus was preliminarily evacuated of air to $10^{-6}$ Torr ($133 \times 10^{-6}$ (Pa)) or below, and an oxygen gas was introduced to 0.01 Torr (1.33 (Pa)) and then sputtering was carried out. The substrate temperature was set at room temperature. The sputtering power was set at 67 W (metal tin target) and 300 W (metal tungsten target). The backpressure was $8 \times 10^{-4}$ (Pa).

The formed film was subjected to heat treatment in an Ar gas containing 3 vol % of hydrogen at 500° C. for 60 minutes to obtain a SnWO$_4$-containing film.

The composition of the formed film was, when its chemical composition is expressed as Sn(x)W(y)O(z), x=0.98, y=1.02 and z=4.

The formed SnWO$_4$-containing film was evaluated as follows. The results are shown in Table 1. In Examples 2 and 3, the formed SnWO$_4$-containing film was evaluated in the same manner and the results are shown in Table 1.

(1) Thickness

Measured by a feeler type film thickness measuring apparatus (Dektak3 Sloan Tech.).

(2) Film Composition x and y: Measured by EPMA (JXA-8200: manufactured by JEOL Ltd.).

z: First, a SnWO$_4$ film wherein, when its chemical composition is expressed as Sn(x)W(y)O(z), x=y and z=4 was analyzed by an X-ray diffraction apparatus. Then, the SnWO$_4$-containing film in Example 1 was analyzed by the X-ray diffraction apparatus, and when peaks appeared at almost the same positions, it is estimated that z=4 in the same manner as the conventional SnWO$_4$ film.

(3) Crystallinity

Measured by an X-ray diffraction apparatus (XRD-6000: manufactured by Shimadzu Corporation).

(4) Transparency (Visible Light Transmittance)

Measured by a spectrophotometer (UV-3500, manufactured by Shimadzu Corporation) in accordance with JIS-R3106 (1998).

(5) Electrical Conductivity

The sheet resistance was measured by a resistivity measuring method by Van der Pauw method.

(6) Judgment Whether n-Type or p-Type

Hall effect measurement was conducted to judge whether n-type or p-type from electrical properties of the film.

Example 2

A SnWO$_4$-containing film was obtained in the same manner as in Example 1 except that the sputtering power applied to the metal tin target was 73 W instead of 67 W.

The composition of the formed film was, when its chemical composition is expressed as Sn(x)W(y)O(z), x=1.02, y=0.98 and z=4.

Example 3

Comparative Example

A SnWO$_4$-containing film was obtained in the same manner as in Example 1 except that the sputtering power applied to the metal tin target was 70 W instead of 67 W.

The composition of the formed film was, when its chemical composition is expressed as Sn(x)W(y)O(z), x=1, y=1 and z=4.

TABLE 1

| | x–y | Crystal-linity | Visible light transmit-tance (%) | Sheet resistance ($\Omega$/□) | n-type or p-type |
|---|---|---|---|---|---|
| 1 | −0.04 | α-type | 85 | 890 | n-type |
| 2 | 0.04 | α-type | 88 | 5,930 | p-type |
| 3 | 0 | Amorphous | 82 | 983,600 | No electrical conductivity |

As shown in Examples 1 and 2, formation of a SnWO$_4$-containing film excellent in electrical conductivity and transparency is possible by adjusting x–y to be within an appropriate range. Further, by changing the compositional ratios of Sn and W, n-type and p-type films can selectively be formed easily, such being excellent in general purpose properties. Further, the compositional ratios of Sn and W can be changed only by changing the sputtering power, such being excellent in productivity.

In Example 3, since ratios of Sn and W are the same, n-type and p-type films cannot selectively be formed, such being unfavorable.

INDUSTRIAL APPLICABILITY

The electrically conductive material of the present invention is excellent in electrical conductivity and is capable of exhibiting n-type and p-type electrical conductivity by adjusting the composition of Sn and W, and is thereby particularly useful as a material of an electrode for FPD and a solar battery.

The entire disclosure of Japanese Patent Application No. 2005-088957 filed on Mar. 25, 2005 including specification, claims, drawings and summary is incorporated herein by reference in its entirety.

What is claimed is:

1. A p-type electrically conductive material containing Sn, W and oxygen, wherein when its chemical composition expressed as Sn(x)W(y)O(z), x, y and z satisfy the following formulae (1) to (4):

$$0.7 < x < 1.3 \quad (1)$$

$$0.7 < y < 1.3 \quad (2)$$

$$3.2 < z \leq 4.0 \quad (3)$$

$$0.001 < (x-y) < 0.05. \quad (4)$$

2. The electrically conductive material according to claim 1, which contains an alpha stannous tungstate type crystal structure.

3. The electrically conductive material according to claim 1, which has a total content of Sn, W and oxygen of at least 70 at %.

4. The electrically conductive material according to claim 1, wherein x, y and z in Sn(x)W(y)O(z) satisfy (x+y)×1.5 ≤ z ≤ (x+y)×2.5.

5. The electrically conductive material according to claim 4, wherein (x+y)×1.8 ≤ z ≤ (x+y)×2.2.

6. The electrically conductive material according to claim 1, which is in a membrane shape.

7. The electrically conductive material according to claim 6, which when in the form of a film, has a sheet resistance of at most 5×10$^4$ $\Omega$/□.

8. The electrically conductive material according to claim 6, which when in the form of a film, has a sheet resistance of at most 5×10$^3$ $\Omega$/□.

9. The electrically conductive material according to claim 1, which is formed into a membrane and then subjected to heat treatment in a gas containing hydrogen.

10. The electrically conductive material according to claim 9, wherein the heat treatment is carried out in an inert gas containing from 1 to 5 vol % of said hydrogen, at from 200 to 600° C. for from 10 to 100 minutes.

11. The electrically conductive material according to claim 1, wherein 0.9 ≤ x ≤ 1.1, 0.9 ≤ y ≤ 1.1, and 3.5 ≤ z ≤ 4.0.

12. The electrically conductive material according to claim 1, which has a total content of Sn, W and oxygen of at least 90 at %.

13. The electrically conductive material according to claim 1, which is in the form of a film, and which is formed by a sputtering method.

14. The electrically conductive material according to claim 1, which is in the form of a film, and which has a thickness of from 10 to 300 nm.

15. The electrically conductive material according to claim 1, wherein X+y=2.0.

16. A method of forming a film of the electrically conductive material according to claim 1, comprising forming said film by sputtering.

* * * * *